(12) United States Patent
Kase et al.

(10) Patent No.: US 6,191,427 B1
(45) Date of Patent: Feb. 20, 2001

(54) ION IMPLANTATION SYSTEM AND METHOD SUITABLE FOR LOW ENERGY ION BEAM IMPLANTATION

(75) Inventors: Masataka Kase; Yoshiyuki Niwa, both of Kawasaki (JP)

(73) Assignee: Fujitsu Limited, Kawasaki (JP)

( * ) Notice: Under 35 U.S.C. 154(b), the term of this patent shall be extended for 0 days.

(21) Appl. No.: 09/143,101

(22) Filed: Aug. 28, 1998

(30) Foreign Application Priority Data

Mar. 27, 1998 (JP) ................................................ 10-082147

(51) Int. Cl.[7] .............................. H01J 37/30; H05H 3/00
(52) U.S. Cl. ...................................... 250/492.21; 251/398
(58) Field of Search ............................ 258/492.21, 398, 258/251

(56) References Cited

U.S. PATENT DOCUMENTS

| | | | |
|---|---|---|---|
| 5,134,301 | * 7/1992 | Kamata et al. | 250/492.21 |
| 5,177,366 | * 1/1993 | King et al. | 250/492.21 |
| 5,399,871 | * 3/1995 | Ito et al. | 250/492.21 |
| 5,576,538 | * 11/1996 | Sakai et al. | 250/251 |
| 5,818,040 | * 10/1998 | Kinoshita et al. | 250/251 |
| 5,892,236 | * 4/1999 | Takahashi et al. | 250/492.21 |

* cited by examiner

*Primary Examiner*—Bruce C. Anderson
(74) *Attorney, Agent, or Firm*—Armstrong, Westermen, Hattori, McLeland & Naughton

(57) ABSTRACT

In an ion implantation system, an ion beam generator generates and emits an ion beam containing ions of a target impurity element. A mass analyzing system derives desired ions from the ion beam to output an ion beam containing the desired ions. The ion beam emitted from the mass analyzing system becomes incident upon an inner cavity defined by a beam line. An electrostatic lens is being disposed in the inner cavity. The electrostatic lens converges the ion beam entered the inner cavity. The ion beam emitted from the beam line impinges upon a substrate into which impurities are to be implanted. A vacuum pump is being mounted on the beam line to evacuate the inner cavity of the beam line.

9 Claims, 6 Drawing Sheets

ION IMPLANTATION SYSTEM AND METHOD SUITABLE FOR LOW ENERGY ION BEAM IMPLANTATION

This application is based on Japanese Patent Application No. 10-82147 filed on Mar. 27, 1998, the entire contents of which are incorporated herein by reference.

BACKGROUND OF THE INVENTION a) Field of the Invention

The present invention relates to an ion implantation system and method, and more particularly to an ion implantation system and method suitable for implantation by a low energy ion beam.

b) Description of the Related Art

High integration of CMOS semiconductor integrated circuit devices nowadays is associated with some problem of short channel effects which may cause a lowered performance of MOS transistors, a lowered drain current, a threshold value shift and the like. Shallow source and drain regions are effective for suppressing the short channel effects. In order to form shallow source and drain regions, it is desired to use a low energy ion beam for ion implantation.

When ions are implanted at a low energy, a process time per unit doping amount becomes long because the ion beam current is small. In order to avoid a prolonged process time, it is necessary to increase the ion beam current at a low energy. As the beam current is increased, the ion beam becomes likely to be diverged by the space-charge effects. In order to prevent ion beam divergence, a method has been proposed which converges an ion beam by disposing an electrostatic lens along a beam line.

The present inventors have found that ion implantation with a low energy ion beam converged by an electrostatic lens is not, however, sufficient for forming shallow source and drain regions.

SUMMARY OF THE INVENTION

It is an object of the present invention to provide an ion implantation system suitable for forming shallow impurity doped regions.

It is another object of the present invention to provide an ion implantation method suitable for forming shallow impurity doped regions.

According to one aspect of the present invention, there is provided an ion implantation system comprising: ion beam generating means for generating and emitting an ion beam containing ions of a target impurity element; a mass analyzing system for receiving the ion beam emitted from the ion beam generating means and deriving desired ions from the received ion beam to output an ion beam containing the desired ions; a beam line for defining an internal cavity upon which the ion beam emitted from the mass analyzing system becomes incident and outputting the Ion beam propagated in the internal cavity; an electrostatic lens disposed in the inner cavity of the beam line for converging the ion beam incident upon the inner cavity; substrate holding means for holding a substrate into which impurities are to be implanted, in such a manner that the ion beam emitted from the beam line becomes incident upon the substrate; and evacuating means coupled to the beam line for evacuating the inner cavity of the beam line.

According to another aspect of the present invention, there is provided an ion implantation method comprising the steps of: generating an ion beam containing ions of a target impurity; making the ion beam be incident upon an inner cavity of a beam line and converging the incident ion beam with an electrostatic lens disposed in the inner cavity, the ion beam being converged while an inside of the inner cavity is maintained evacuated with evacuating means coupled to the beam line; and impinging the converged ion beam upon a substrate to implant the ions into the substrate.

Since the inner cavity in which the electrostatic lens is disposed is evacuated, the ion beam propagating through the electrostatic lens becomes hard to be influenced by the residual gas in a space near the ion beam. Ions become hard to be neutralized by the residual gas, so that each ion is accelerated or decelerated with the electrostatic lens reliably by a predetermined amount. Therefore, a disturbance of the energy distribution of the ion beam to be caused by the electrostatic lens can be suppressed.

According to another aspect of the present invention, there is provided an ion implantation system comprising: ion beam generating means for generating and emitting an ion beam containing ions of a target impurity element; a mass analyzing system for receiving the ion beam emitted from the ion beam generating means and deriving desired ions from the received ion beam to output an ion beam containing the desired ions; a beam line for defining an internal cavity upon which the ion beam emitted from the mass analyzing system becomes incident and outputting the ion beam propagated in the internal cavity; an electrostatic lens disposed in the inner cavity of the beam line for once accelerating and converging and thereafter decelerating the ion beam incident upon the inner cavity, an energy of the ion beam after the acceleration being controlled to have an energy three time or higher than an energy of the ion beam before the acceleration; and substrate holding means for holding a substrate into which impurities are to be implanted, at a position where the ion beam emitted from the beam line becomes incident upon.

According to another aspect of the present invention, there is provided an ion implantation method comprising the steps of: generating an ion beam containing ions of a target impurity; making the ion beam be incident upon an inner cavity of a beam line and converging the incident ion beam with an electrostatic lens disposed in the inner cavity, the electrostatic lens accelerating and converging the ion beam to have an energy three time or higher than an energy of the ion beam before the ion beam becomes incident upon the electrostatic lens, and thereafter decelerating the ion beam; and impinging the decelerated ion beam upon a substrate to implant the ions into the substrate.

If ions after once accelerated by the electrostatic lens are changed to neutral atoms, these atoms are not thereafter affected by a downstream electric field. Therefore, the atoms are emitted from the electrostatic lens without being decelerated. Since the energy of the accelerated ion beam is set three times or more than that before the acceleration, the energy of the neutral atoms emitted from the electrostatic lens is as high as about three times the decelerated ions, even if the ions are changed to neutral atoms. Accordingly, implantation into a deep region of high energy neutral atoms can be suppressed.

According to another aspect of the present invention, there is provided an ion implantation method comprising the steps of: generating an ion beam containing ions of a target impurity having an energy of 5 keV or lower; making the ion beam be incident upon an inner cavity of a beam line and converging the incident ion beam with an electrostatic lens disposed in the inner cavity; and impinging the converged ion beam upon a single crystal semiconductor substrate to implant the ions into the semiconductor substrate without passing the ion beam through an amorphous layer made of elements constituting the semiconductor substrate.

Shallow implantation is possible by using an ion beam having an energy of 5 keV or lower. Since the ion beam is converged by the electrostatic lens, the ion implantation amount can be prevented from being reduced by the divergence of the ion beam. If a crystal substrate without an amorphous surface layer is used, an impurity distribution generally the same as that without the active electrostatic lens can be obtained.

As above, when ions are implanted by using an ion beam converged by the electrostatic lens, the ions can be prevented from being implanted into a substrate deep region. With this method, shallow source and drain regions of a MOS transistor can be formed so that the short channel effects can be alleviated.

DETAILED DESCRIPTION OF THE PREFERRED EMBODIMENTS

Prior to giving the description of embodiments of the invention, evaluation experiments of ion implantation made by the present inventors and the experiment results will be described.

Figure 1:
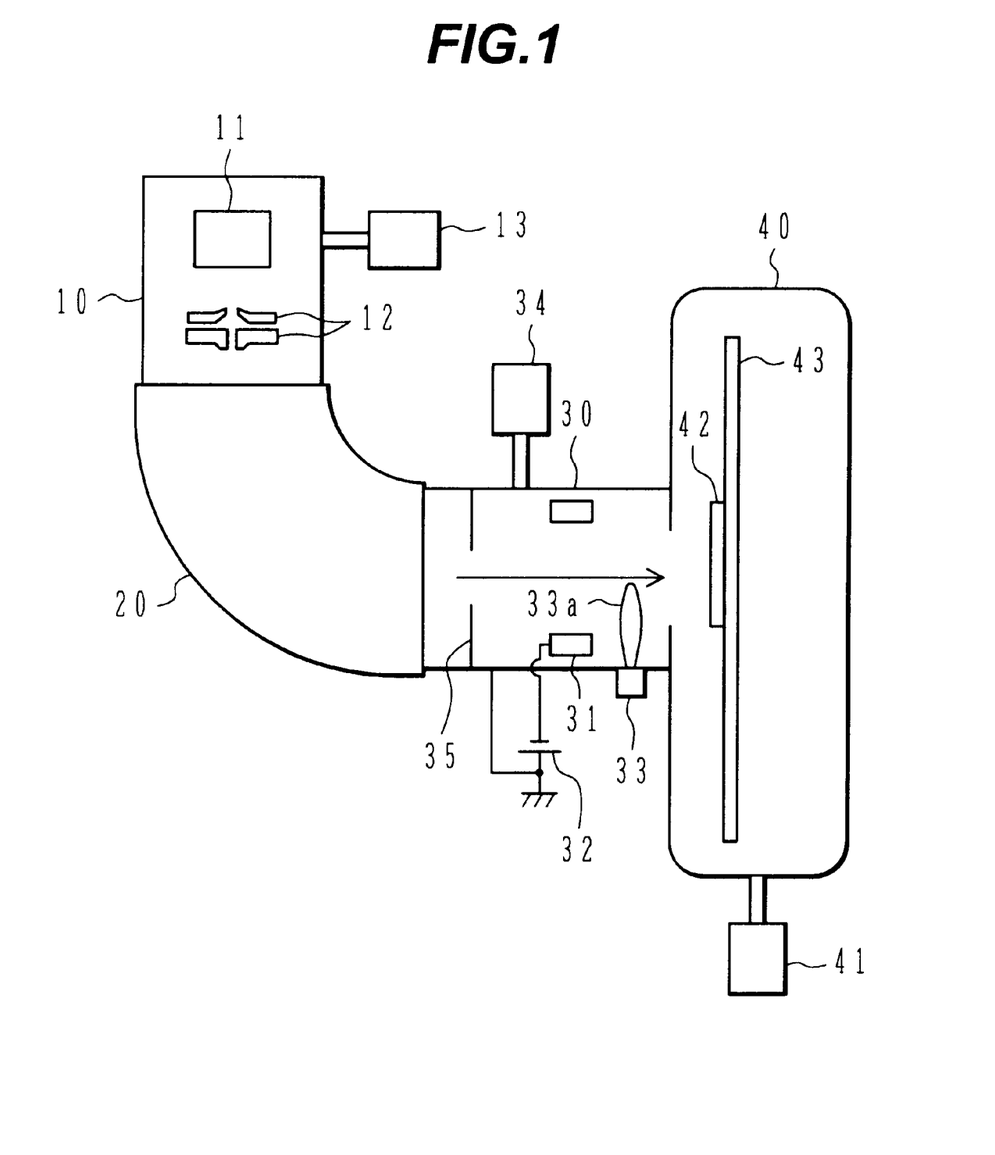
FIG. 1 is a schematic diagram showing an ion implantation system according to an embodiment of the invention, evaluation experiments having made by using this ion implantation system.

FIG. 1 is a schematic diagram showing an ion implantation system used for evaluation experiments of ion implantation. This ion implantation system is fundamentally same as an ion implantation system of an embodiment of the invention, and so FIG. 1 is referenced again when the embodiment is described.

As shown in FIG. 1, this ion implantation system is constituted of an ion beam generator 10, a mass analyzing system 20, a beam line 30, and an ion implanting chamber 40. An ion source 11 and a pickup electrode 12 are housed in the ion beam generator 10. The ion source 11 generates ions of an impurity element to be implanted into a substrate. The pickup electrode 12 pickups ions generated by the ion source 11 and guides it to the outside of the ion beam generator 10. The inside of the ion beam generator 10 is evacuated with a vacuum pump 13 and maintained at about $1 \times 10^{-3}$ Torr.

The ion beam emitted from the ion beam generator 10 becomes incident upon the mass analyzing system 20 including a deflection electromagnet. The mass analyzing system 20 derives only those ions having a desired mass and kinetic energy from the incident ion beam, and outputs an ion beam containing desired ions with a uniform kinetic energy.

The ion beam emitted from the mass analyzing system 20 passes through an aperture disposed near at the inlet port of the beam line 30 and enters an inner cavity of the beam line 30. An electrostatic lens 31 is disposed in the inner cavity of the beam line 30. The side wall of the beam line 30 is grounded, and the electrostatic lens 31 is applied with a negative voltage supplied from a d.c. voltage source 32.

The ion beam propagating in the beam line 30 is once accelerated and converged when it enters the electrostatic lens 31. The ion beam is converged while it propagates through the electrostatic lens 31. When the ion beam exits from the electrostatic lens 31, it is decelerated to resume the original energy, and diverged. In total, the convergence operation is stronger than the divergence so that the ion beam is converged after it passed through the electrostatic lens 31.

A plasma generating means 33 is mounted on the side wall of the beam line 30 at the downstream of the electrostatic lens 31. The plasma generating means 33 generates plasma 33a of Ar or Xe which electrically applies the ground potential to the space in which the ion beam propagates. Therefore, electrons become resident in the space in which the ion beam propagates and this space is electrically neutralized. Electrons resident in this space are attracted by the substrate surface positively charged by ion implantation, and prevent the charge accumulation of the substrate.

The ion beam emitted from the beam line 30 becomes incident upon the ion implanting chamber 40. The ion implanting chamber 40 is evacuated with a vacuum pump 41 and maintained at about $1 \times 10^{-5}$ to $1 \times 10^{-4}$ Torr. Disposed in the ion implanting chamber 40 is a substrate holding mechanism 43 for holding a substrate 42 into which ions are implanted. The substrate holding mechanism 43 holds the substrate 42 in such a manner that the incident ion beam is made to correctly impinge upon the substrate 42. The substrate holding mechanism 43 holds a plurality of substrates on a certain circular line and transports the substrates along this line. When the circularly moving substrate 42 traverses the ion beam impinging position, ions are implanted into this substrate.

Figure 5:
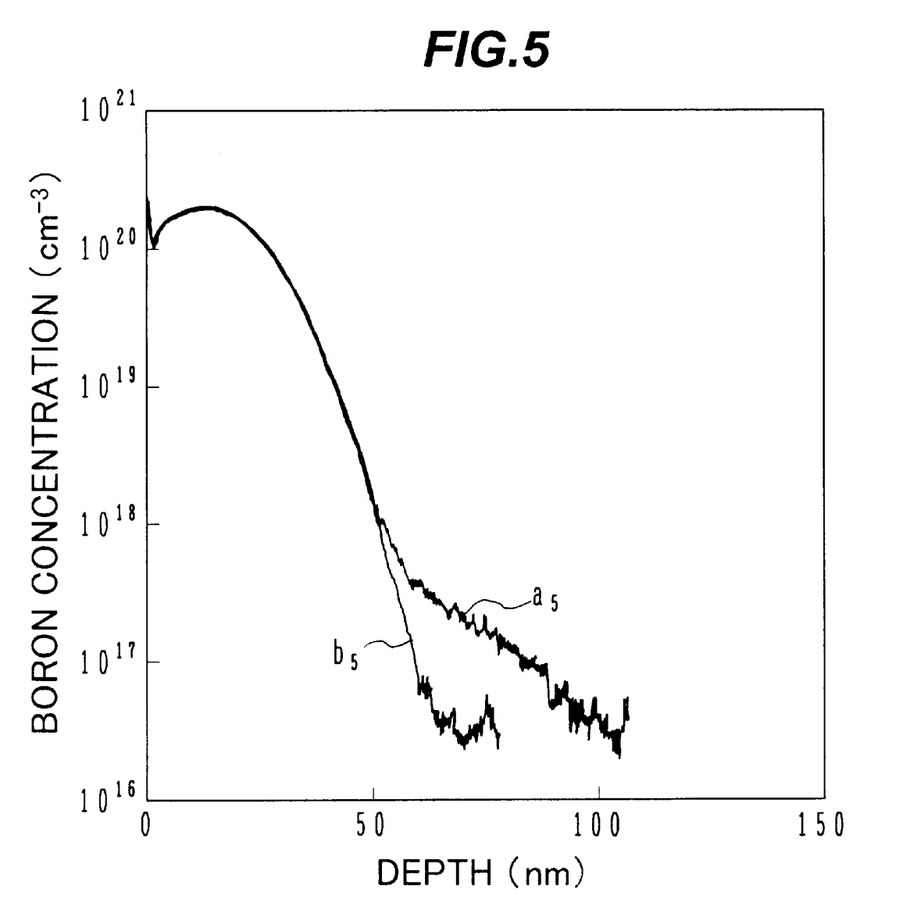
FIG. 5 is a graph showing a boron concentration distribution relative to a depth direction of a substrate, illustrating the evaluation experiment results of ion implantation.

FIG. 5 is a graph showing an impurity concentration distribution relative to a substrate depth direction, if boron ions ($B^+$) are implanted into a silicon substrate at an acceleration energy of 5 keV and a dose of $1 \times 10^{15}$ cm$^{-2}$ by using the ion implantation system shown in FIG. 1. A solid line as in FIG. 5 was obtained when a voltage of −15 kV was applied to the electrostatic lens 31 shown in FIG. 1, whereas a solid line $b_5$ was obtained when no voltage was applied to the electrostatic lens 31. The silicon substrate was prepared whose surface layer was changed to an amorphous layer before ion implantation was performed. This amorphous surface layer was formed by implanting Ge$^+$ ions at an acceleration energy of 40 keV and a dose of $5 \times 10^{14}$ cm$^{-2}$, and then at an acceleration energy of 80 keV and a dose of $1 \times 10^{15}$ cm$^{-2}$.

As compared to the case where the electrostatic lens 31 was not made active, the boron concentration was high at the region deeper than 50 nm when the electrostatic lens 31 was made active. A high boron concentration in a deeper region may be ascribed to the following.

Some ions among the ions once accelerated by the electrostatic lens 31 are changed into neutral boron atoms by the influence of gas resident in the beam line 30. The neutral boron atoms are not decelerated when they emits from the electrostatic lens 31. Therefore, boron atoms having an energy higher than a desired energy are directly impinged upon the substrate 42. It can be supposed that implantation of high energy boron atoms makes a high boron concentration in the deeper region.

Next, the ion implantation method solving the above problem according to the first embodiment will be described.

FIG. 1 is a schematic diagram showing an ion implantation system according to an embodiment of the invention. A vacuum pump 34 is coupled to the beam line 30. The vacuum pump 34 may be a turbo molecular pump. The other structures are the same as the ion implantation system used with the above evaluation experiments, and the description thereof is omitted.

In the ion implantation method of the first embodiment, the pressure in the inner cavity of the beam line 30 is set at $1.7 \times 10^{-6}$ Torr, as compared to the pressure of about $1.3 \times 10^{-5}$ Torr in the inner cavity of the beam line when the above evaluation experiments were made. The vacuum degree of the space where the electrostatic lens 30 is disposed, is set higher than that of the space where the ion source is disposed and that of the space in the ion implanting chamber. Therefore, the ion beam passing through the space where the electrostatic lens 30 is disposed is less affected by the resident gas in the space. It is supposed therefore that ions are difficult to be changed to electrically neutral atoms.

Figure 2:
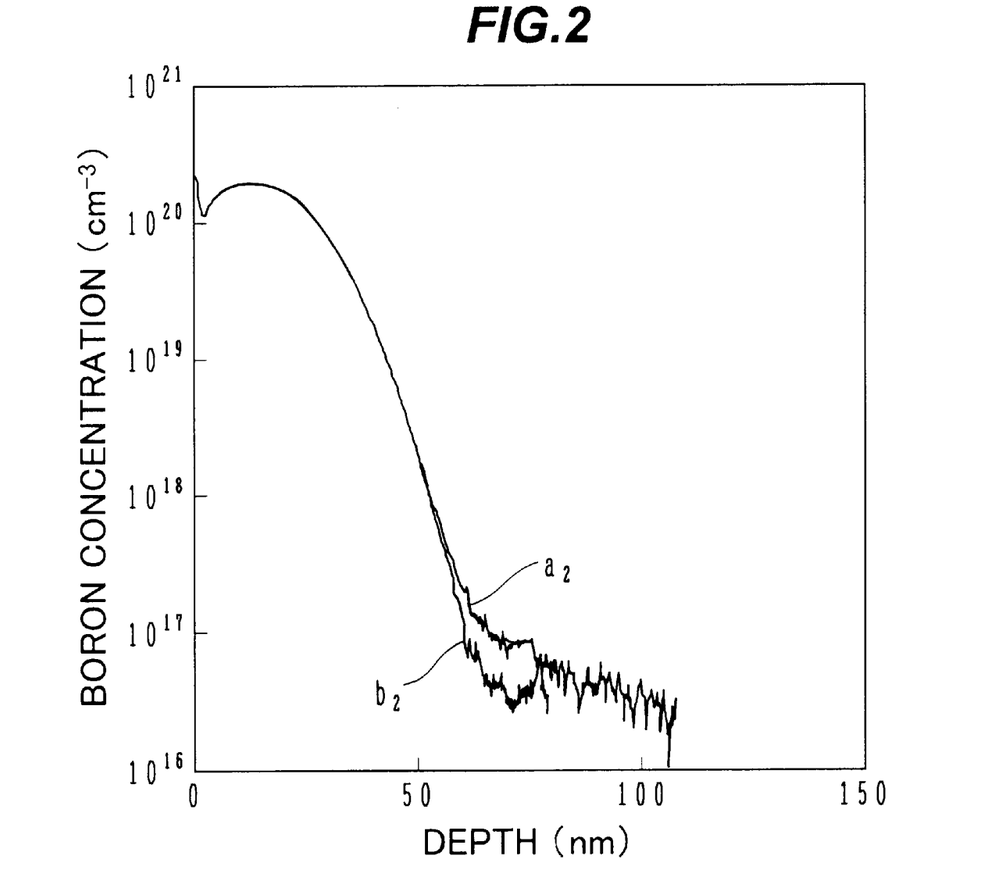
FIG. 2 is a graph showing a boron concentration distribution relative to a depth direction of a substrate, when ion implantation is performed by a method according to a first embodiment of the invention.

FIG. 2 is a graph showing a boron concentration distribution relative to a substrate depth direction, when boron ions are implanted by the first embodiment method using the ion implantation apparatus shown in FIG. 1. The ion implantation conditions are the same as those of the evaluation experiments. A solid line $a_2$ in FIG. 2 was obtained when a voltage of $-15$ kV was applied to the electrostatic lens 31 shown in FIG. 1, whereas a solid line $b_2$ was obtained when no voltage was applied to the electrostatic lens 31. As compared to the graph shown in FIG. 5, it can be seen that the boron concentration in the region deeper than 50 nm when the electrostatic lens 31 is made active lowers its value near to the boron concentration when the electrostatic lens 31 is made inactive.

As above, by coupling the vacuum pump to the beam line 30 where the electrostatic lens 31 is disposed and raising the vacuum degree of the inside of the beam line 30, shallow implantation using a low energy ion beam becomes possible. In the first embodiment method, although the space where the electrostatic lens 31 is disposed is evacuated to about $1.7 \times 10^{-6}$ Torr, the same effect as above can also be expected when the pressure of the space is $5 \times 10^{-6}$ Torr or lower.

After ions are passed through the electrostatic lens 31 and decelerated, the kinetic energies of the ions will not change even if the ions are changed to neutral atoms. Therefore, the vacuum degree of the space at the downstream of the electrostatic lens 31 may be lower than that of the space where the electrostatic lens 31 is disposed. It is therefore preferable that the plasma generating means for electrically neutralizing the space in which the ion beam progresses, is mounted at the downstream of the electrostatic lens 31 and vacuum pump 34.

Figure 6:
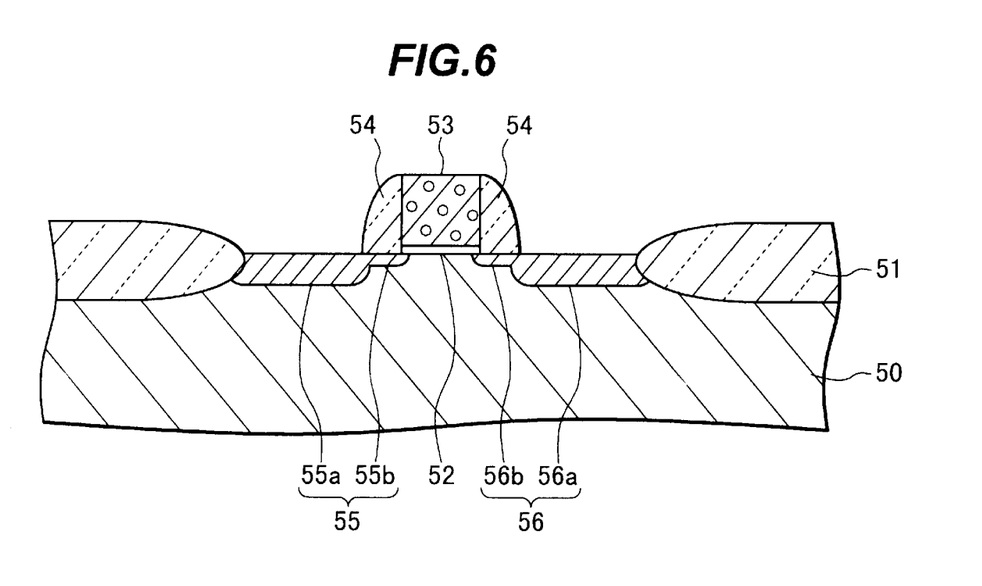

FIG. 6 is a cross sectional view of a substrate on which a MOSFET is formed by using the ion implantation apparatus shown in FIG. 1. A field oxide film 51 is formed on the surface of a p-type silicon substrate 50. The field oxide film 51 defines an active region. On a partial surface area of the active region, a gate oxide film 52 and a gate electrode are being laminated in this order. The gate electrode 53 may be made of polysilicon.

By using the gate electrode 53 as a mask, phosphorous ions are implanted by using the ion implantation system shown in FIG. 1. With this ion implantation, low concentration regions 55b and 56b of a lightly doped drain (LDD) structure are formed.

Side spacer insulators 54 are formed on the side walls of the gate electrode 53. For example, the side spacer insulators 54 are formed by depositing an $SiO_2$ film over the whole substrate surface and anisotropically etching it through RIE.

By using the gate electrode 53 and side spacer insulators 54 as a mask, phosphorous ions are implanted by the ion implantation system shown in FIG. 1. With this ion implantation, high concentration regions 55a and 56a of the LDD structure are formed. Annealing is thereafter performed to activate implanted phosphorous ions to form a source region 55 and a drain region 56.

Ion implantation using the ion implantation system shown in FIG. 1 can form shallow source and drain regions 55 and 56 with good reproductivity. With the shallow source and drain regions 55 and 56, it is possible to suppress the performance of MOSFETs from being degraded by the short channel effects.

Next, the ion implantation method according to the second embodiment will be described. Although the voltage of $-15$ kV is applied to the electrostatic lens 31 in the evaluation experiments, in the second embodiment, a voltage of $-5.5$ kV is applied. The other conditions are the same as those of the evaluation experiments.

Figure 3:
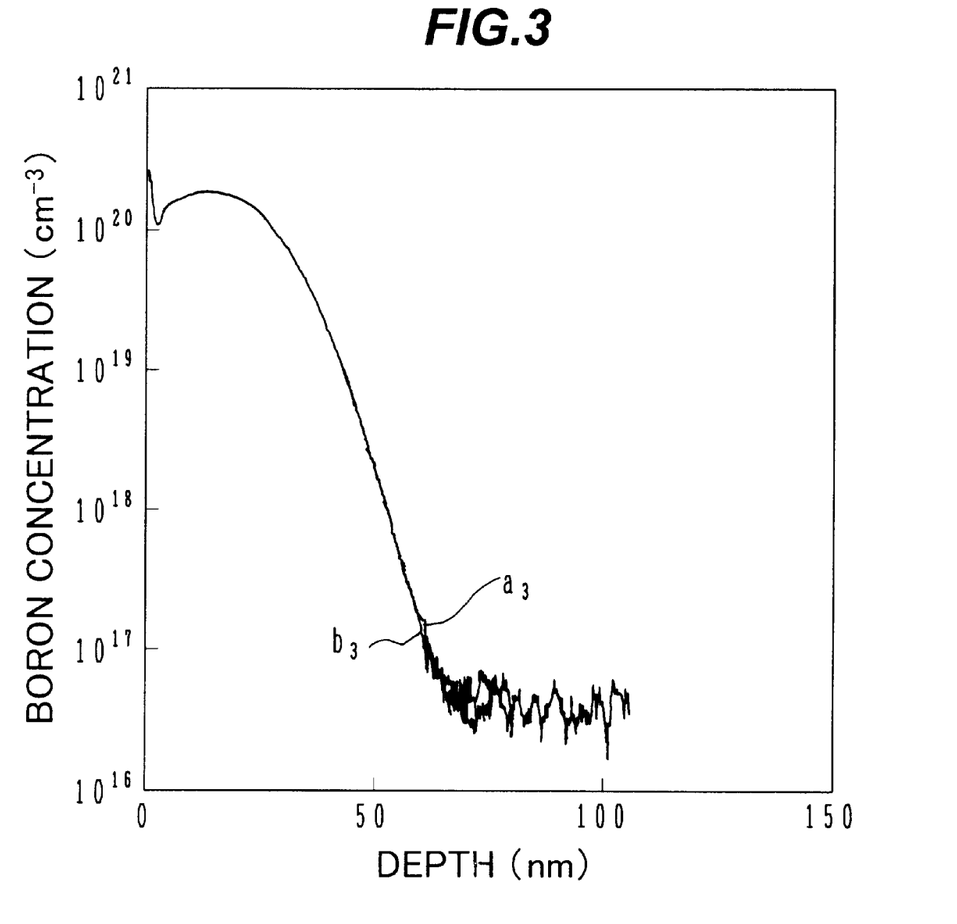
FIG. 3 is a graph showing a boron concentration distribution relative to a depth direction of a substrate, when ion implantation is performed by a method according to a second embodiment of the invention.

FIG. 3 is a graph showing a boron concentration distribution relative to a substrate depth direction, when boron ions are implanted by the second embodiment method. A solid line $a_3$ in FIG. 3 was obtained when ions were implanted by the second embodiment method, whereas a solid line $b_3$ was obtained when no voltage was applied to the electrostatic lens 31. There is almost no difference between both the boron concentration distributions. The reason for this may be ascribed to the following. Even if ions once accelerated by the electrostatic lens 31 and changed to neutral atoms impinge upon the substrate at their energy, this energy is as high as about a twofold of the desired energy. Therefore, this ion implantation does not greatly influence the impurity concentration distribution.

In the second embodiment method, a voltage applied to the electrostatic lens 31 is set to $-5.5$ kV, and the ion beam is accelerated to have about a twofold of the initial ion beam energy of 5 keV. In order not to influence the impurity concentration distribution too much, it is preferable that the energy of the ion beam after once accelerated by the electrostatic lens 31 is set equal to or smaller than three times the ion beam energy before the acceleration, or more preferably equal to or smaller than 2.5 times.

However, if the energy after the acceleration is set low, a sufficient convergence effect cannot be obtained. In order to provide a sufficient convergence effect, the ion beam energy after once accelerated by the electrostatic lens 31 is preferably set equal to or larger than twice the ion beam energy before the acceleration.

In the evaluation experiments and the first and second embodiment methods, the amorphous surface layer is formed on the substrate into which ions are implanted. Next, the third embodiment method will be described in which the amorphous surface layer is not formed.

Upon implanting ions into a shallow region by using a low energy ion beam, ions enter a deep region because of the channeling effects. In order to prevent this, the crystalline structure of the surface layer of a single silicon substrate is broken and an amorphous surface layer is formed on the substrate, before the ion implantation is performed. However, with the amorphous surface layer, the impurity concentration distribution becomes easy to be influenced by the electrostatic lens.

Figure 4:
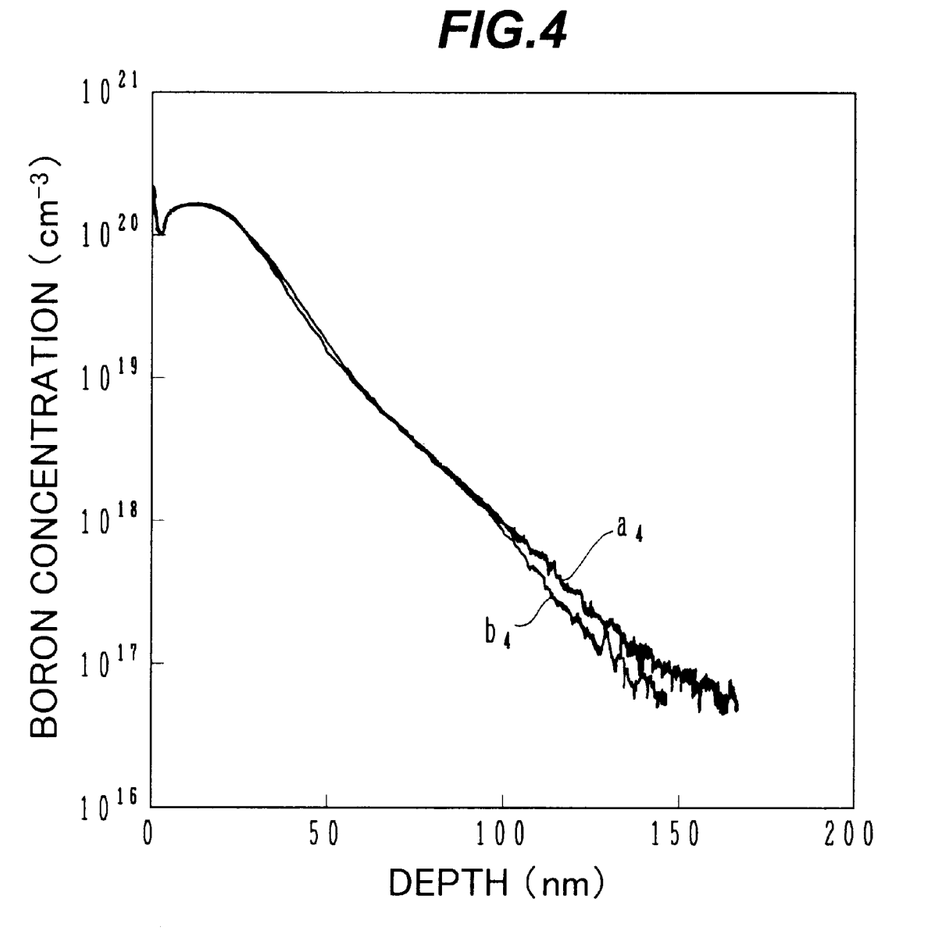
FIG. 4 is a graph showing a boron concentration distribution relative to a depth direction of a substrate, when ion implantation is performed by a method according to a third embodiment of the invention.

FIG. 4 is a graph showing a boron concentration distribution relative to a substrate depth direction, when boron ions are implanted on a silicon substrate without an amorphous surface layer. A solid line $a_4$ in FIG. 4 was obtained when a voltage of −15 kV was applied to the electrostatic lens 31 shown in FIG. 1, whereas a solid line $b_4$ was obtained when no voltage was applied to the electrostatic lens 31. The inside of the beam line 30 was not evacuated with the vacuum pump 34.

There was no significant difference between when the electrostatic lens 31 was made active and when it was not made active. Namely, the impurity ion concentration distribution was hard to be influenced by the electrostatic lens, when ions were implanted into the crystalline substrate having no amorphous surface layer. Therefore, if the ion beam converged by the electrostatic lens is directly impinged upon a single crystal semiconductor substrate without being passed through an amorphous surface layer made of elements constituting the semiconductor substrate, then the adverse effect of the electrostatic lens can be avoided. In this case, as compared to the substrate with an amorphous surface layer, impurities are distributed more deeper. However, since the process of forming the amorphous surface layer is omitted, the number of processes can be reduced and the productivity can be improved. When ions are implanted into a shallow region, it is preferable to set the ion beam energy to 5 keV or smaller.

In the above embodiments, boron ions are implanted into a silicon substrate. Other substrates may also be used. Ions other than boron ions may also be used. For example, an SiGe substrate, an Si substrate on which an SiGe layer is epitaxially grown, and other substrates may also be used. Impurity ions may be $As^+$, $P^+$, $BF_2^+$, and the like.

The present invention has been described in connection with the preferred embodiments. The invention is not limited only to the above embodiments. It is apparent that various modifications, improvements, combinations, and the like can be made by those skilled in the art.

What is claimed is:

1. An ion implantation system comprising:

ion beam generating means for generating and emitting an ion beam containing ions of a target impurity element;

a mass analyzing system for receiving the ion beam emitted from said ion beam generating means and deriving desired ions from the received ion beam to output an ion beam containing the desired ions;

a beam line for defining an internal cavity upon which the ion beam emitted from said mass analyzing system becomes incident and outputting the ion beam propagated in the internal cavity;

an electrostatic lens disposed in the inner cavity of said beam line for converging the ion beam incident upon the inner cavity;

substrate holding means for holding a substrate into which impurities are to be implanted, in such a manner that the ion beam emitted from said beam line becomes incident upon the substrate;

evacuating means coupled to said beam line for evacuating the inner cavity of said beam line; and plasma generating means for generating plasma which electrically neutralizes a space in which the ion beam propagates in said beam line, said plasma generating means being mounted downstream of a position of said electrostatic lens in said beam line and a position of said evacuating means.

2. An ion implantation method comprising the steps of:

generating an ion beam containing ions of a target impurity, said ion beam having an energy of 5 keV or lower;

making the ion beam be incident upon an inner cavity of a beam line and converging the incident ion beam with an electrostatic lens disposed in the inner cavity, the ion beam being converged while an inside of the inner cavity is maintained evacuated with evacuating means coupled to the beam line; and impinging the converged ion beam upon a substrate to implant the ions into the substrate.

3. An ion implantation method according to claim 2, further comprising the step of electrically neutralizing a space near the converged ion beam after said step of converging the ion beam.

4. An ion implantation system comprising:

ion beam generating means for generating and emitting an ion beam containing ions of a target impurity element;

a mass analyzing system for receiving the ion beam emitted from said ion beam generating means and deriving desired ions from the received ion beam to output an ion beam containing the desired ions;

a beam line for defining an internal cavity upon which the ion beam emitted from said mass analyzing system becomes incident and outputting the ion beam propagated in the internal cavity;

an electrostatic lens disposed in the inner cavity of said beam line for once accelerating and converging and thereafter decelerating the ion beam incident upon the inner cavity, an energy of the ion beam after the acceleration being controlled to have an energy equal to or smaller than three times an energy of the ion beam before the acceleration; and substrate holding means for holding a substrate into which impurities are to be implanted, at a position where the ion beam emitted from said beam line becomes incident upon.

5. An ion implantation system according to claim 4, further comprising evacuating means mounted on said beam line for evacuating the inner cavity of said beam line.

6. An ion implantation method comprising the steps of:

generating an ion beam containing ions of a target impurity;

making the ion beam be incident upon an inner cavity of a beam line and converging the incident ion beam with an electrostatic lens disposed in the inner cavity, the electrostatic lens accelerating and converging the ion beam to have an energy equal to or lower than three times an energy of the ion beam before the ion beam becomes incident upon the electrostatic lens, and thereafter decelerating the ion beam; and impinging the decelerated ion beam upon a substrate to implant the ions into the substrate.

7. An ion implantation method according to claim 6, further comprising the step of electrically neutralizing a space near the decelerated ion beam after said step of converging the ion beam.

8. An ion implantation method comprising the steps of:
generating an ion beam containing ions of a target impurity having an energy of 5 keV or lower;
making the ion beam be incident upon an inner cavity of a beam line and converging the incident ion beam with an electrostatic lens disposed in the inner cavity; and
impinging the converged ion beam upon a single crystal semiconductor substrate to implant the ions into the semiconductor substrate without passing the ion beam through an amorphous layer made of elements constituting the semiconductor substrate.

9. An ion implantation method, comprising the steps of:
generating an ion beam containing ions of a target impurity;
making the ion beam be incident upon an inner cavity of a beam line and converging the incident ion beam with an electrostatic lens disposed in the inner cavity, the ion beam being converged while an inside of the inner cavity is maintained evacuated with evacuating means coupled to the beam line; and
impinging the converged ion beam upon a substrate to implant the ions into the substrate,
wherein a space where the electrostatic lens is disposed is evacuated to $5 \times 10^{-6}$ Torr or lower.

* * * * *